United States Patent
Ma et al.

(10) Patent No.: US 8,321,189 B1
(45) Date of Patent: Nov. 27, 2012

(54) DECOUPLING OF LINEAR DYNAMICAL SYSTEMS

(76) Inventors: Fai Ma, Berkeley, CA (US); Matthias Morzfeld, Kensington, CA (US); Ali Imam, Fremont, CA (US)

(*) Notice: Subject to any disclaimer, the term of this patent is extended or adjusted under 35 U.S.C. 154(b) by 483 days.

(21) Appl. No.: 12/534,853

(22) Filed: Aug. 3, 2009

Related U.S. Application Data (60) Provisional application No. 61/085,781, filed on Aug. 1, 2008.

(51) Int. Cl.
*G06G 7/48* (2006.01)
(52) U.S. Cl. .......................................................... 703/7
(58) Field of Classification Search ........................ 703/7
See application file for complete search history.

(56) References Cited

OTHER PUBLICATIONS

Ma et al.; A General Methodology for Decoupling Damped Linear Systems; Procedia Engineering 14 (2011) 2498-2502.*

* cited by examiner

*Primary Examiner* — Hugh Jones
(74) *Attorney, Agent, or Firm* — Maryam Imam; IPxLAW Group LLP (57) ABSTRACT

A method and apparatus is disclosed for improving analysis and design of physical structures whose dynamic behavior can be modeled as a linear dynamical system. The method and apparatus is operative to decouple the equations of motion of any linear dynamical systems therewith by processing the equations of motion of any linear dynamical system using a decoupling unit.

16 Claims, 8 Drawing Sheets

DECOUPLING OF LINEAR DYNAMICAL SYSTEMS

CROSS REFERENCE TO RELATED APPLICATIONS

This application claims priority from U.S. Provisional Patent Application No. 61/085,781, for "Decoupling of Linear Dynamical Systems" filed on Aug. 1, 2008, by Ma et al.

BACKGROUND OF THE INVENTION

1. Field of the Invention

The present invention relates generally to the field of linear dynamical systems and particularly to a method and apparatus for decoupling linear dynamical systems.

2. Description of the Prior Art

A linear dynamical system is a certain class of mathematical models of a physical structure, such as for example and without limitation, a building, a bridge, a car, a ship, satellite, airplane or electric circuit. In general, a physical structure, mechanical or electrical, whose dynamic behavior can be predicted with accuracy by a set of linear second-order ordinary differential equations with constant coefficients is, for the purpose of modeling, a linear dynamical system. If the rate at which energy is dissipated within the structure is negligible, the linear dynamical system is termed undamped. If energy dissipation cannot be neglected, the system is said to be damped. In a typical application, the model, i.e. the linear dynamical system, is used to predict the displacement of various components of the physical structure from their equilibrium positions.

A linear dynamical system is generally represented by a set of coupled equations, which are interlinked and cannot be treated independently of each other. This property of coupling is a major barrier to analysis and design. For example, the solution of one equation requires solution of all equations. If coupling can be removed, a set of mutually independent sub-systems, each governed by an independent equation, is obtained. Decoupling is a process by which a complex dynamical system, as represented by a set of coupled equations, is converted into independent sub-systems, with each sub-system specified by only one equation. The significance and advantages of decoupling in analysis and design have long been recognized. In the publication entitled "The Theory of Sound" originally published in 1894 by Lord Rayleigh and later reprinted in 1945 by Dover, N.Y., the well known scientist Lord Rayleigh already expounded on the significance of decoupling and introduced the assumption of proportional damping to decouple a subset of linear dynamical systems. Indeed, the problem of decoupling has attracted the attention of many engineers and scientists in the past century. However, a general procedure for decoupling linear dynamical systems has not been reported.

A time-honored procedure, termed modal analysis or classical modal analysis, known to those of ordinary skill in the art, is available to decouple linear dynamical systems in the absence of damping. An undamped linear system possesses classical normal modes, and in each mode different parts of the system vibrate in a synchronous manner. The normal modes constitute a linear coordinate transformation that decouples the undamped system. This is the essence of modal analysis. In the presence of damping, a linear system cannot be decoupled by modal analysis or by any other prior art technique unless certain restrictive conditions apply. A damped linear system is termed classically damped if it still can be decoupled by modal analysis. Practically speaking, classical damping means that energy dissipation is uniformly distributed throughout the structure. This assumption is violated for systems consisting of two or more parts with significantly different levels of damping. Examples include soil-structure systems, base-isolated structures, and systems in which coupled vibrations of structures and fluids occur. Increasing use of special energy-dissipating devices in control constitutes another important class of examples. In fact, experimental modal testing suggests that no mechanical system is classically damped. Thus, modal analysis is generally not applicable to damped linear systems.

Due to the lack of an exact method for decoupling, engineers routinely invoke a whole array of approximations to continue to base the analysis of linear dynamical systems upon modal analysis. From a practical viewpoint, there is no objection to using approximate techniques to decouple a linear dynamical system. However, rigorous analysis of the errors of approximation committed by these mostly ad hoc techniques has not been conducted. In general, every approximate technique is only suitable for decoupling a subset of linear dynamical systems satisfying certain restrictive assumptions; it is otherwise inadequate for other applications. There is not any prior art technique, either approximate or exact, that is adequate for decoupling any linear dynamical system.

An alternative but more abstract approach to linear dynamical systems is the state space approach, known to those of ordinary skill in the art. In this approach, the second-order equations governing a linear system are recast in a first-order form known as state equations. The problem with this approach is that the number of equations describing the system is artificially doubled. The state space approach has not appealed to practicing engineers, particularly in the fields of structural mechanics and materials. The inordinate amount of computational effort due to the doubling of the number of equations is usually given as a reason. More importantly, there is serious loss of physical insight in tackling the first-order state equations. In addition, unless it is assumed that the state companion matrix is diagonalizable, the state equations still cannot be decoupled exactly with prior art techniques. In short, decoupling in state space analysis is inadequate in many ways.

For the foregoing reasons, there is a need for a method and apparatus for exact decoupling of linear dynamical systems as represented by a set of coupled second-order ordinary differential equations. There is further a need for such a decoupling methodology to be amenable to physical interpretation so as to facilitate and streamline the analysis and design of linear dynamical systems.

SUMMARY OF THE INVENTION

Briefly, an embodiment of the present invention includes a method and apparatus for decoupling a linear dynamical system. An alternative embodiment of the present invention includes a method and apparatus for evaluating the response of any linear dynamical system in free or forced vibration by means of a decoupling unit.

The foregoing and other objects, features and advantages of the present invention will be apparent from the following detailed description of the preferred embodiments which make reference to several figures of the drawing.

IN THE DRAWINGS

FIG. 7(*a*) shows a model of a coupled mechanical circuit 400, as determined by the modeling unit 14.

FIG. 7(*b*) shows a model of a coupled electrical circuit 422, as determined by the modeling unit 14.

FIG. 8(*a*) shows two conceptual mechanical sub-systems that arise by decoupling the system 400 of FIG. 7(*a*), in accordance with an embodiment of the present invention.

FIG. 8(*b*) shows two conceptual electrical sub-systems that arise by decoupling the circuit 422 of FIG. 7(*b*), in accordance with an embodiment of the present invention.

APPENDIX A

Appendix B

DETAILED DESCRIPTION OF THE PREFERRED EMBODIMENTS

In various embodiments of the present invention, a method and apparatus is disclosed for decoupling linear dynamical systems. A linear dynamical system, as a certain class of mathematical models of various physical structures, is represented by a set of linear second-order ordinary differential equations with constant coefficients. In exemplary embodiments, a linear dynamical system models and predicts the dynamic behavior of machinery, structures such as buildings or bridges, transportation vehicles, such as ships, cars, airplanes and satellites, as well as electrical circuits.

In general, a linear dynamical system comprises any device or structure with inertial and linearly elastic properties and whose energy dissipation properties can be modeled as forces proportional to the velocities. A mathematical model of idealized electric circuits with inductors, resistors and capacitors also leads to a set of linear second-order ordinary differential equations with constant coefficients and, therefore, represents a linear dynamical system. The analogy of idealized mechanical and electrical systems is known to those of ordinary skill in the art.

Upon decoupling by the method and apparatus of the various embodiments of the present invention, coupling in the equations is eliminated and a set of mutually independent equations is obtained. The new set of independent (decoupled) equations also models the dynamic behavior of the physical structure under observation. Furthermore, each decoupled equation can be treated efficiently and independently using known techniques. (1) For example, the set of decoupled equations can be solved very efficiently to evaluate and predict the dynamic behavior of the physical device, structure or electric circuit under observation. (2) As a second example, the design and evaluation, using such properties as stability and long-term reliability, of machinery, structures or electric circuits, can be conducted more readily with a set of independent equations. (3) As another example, the energy distribution among the independent decoupled equations can be investigated using prior art techniques, and equations carrying only a small amount of energy can be disregarded. This technique, termed modal reduction, is of particular importance in the modeling of very complex structures. Complex physical systems can only be modeled accurately by a large number of linear equations. Upon decoupling by the method and apparatus of the present invention and subsequent modal reduction as described above, the number of equations needed for accurate modeling of a complex physical system can decrease dramatically. This greatly improves the efficiency of design and analysis of a complex physical system.

There are, however, physical structures that are too complex to be modeled accurately even by a large number of linear equations. These systems are often modeled by a set of nonlinear equations and are, therefore, termed nonlinear systems. Analysis and design of nonlinear systems often involves linearization (such as in many finite element packages), so that a linear dynamical system is obtained as an intermediate product to which the method and apparatus of the various embodiments of the present invention is applicable. Through linearization, the embodiment of the present invention can be utilized to streamline the analysis, response evaluation and design of nonlinear systems.

Linear dynamical systems also arise naturally in diverse areas such as mathematical economics, quantum mechanics and computational physics. The method and apparatus of the embodiments disclosed herein are applicable to linear dynamical systems in any area. For ease of presentation and illustration, the following paragraphs focus on one of many applications of the various embodiments of the present invention in structural dynamics.

Figure 1:
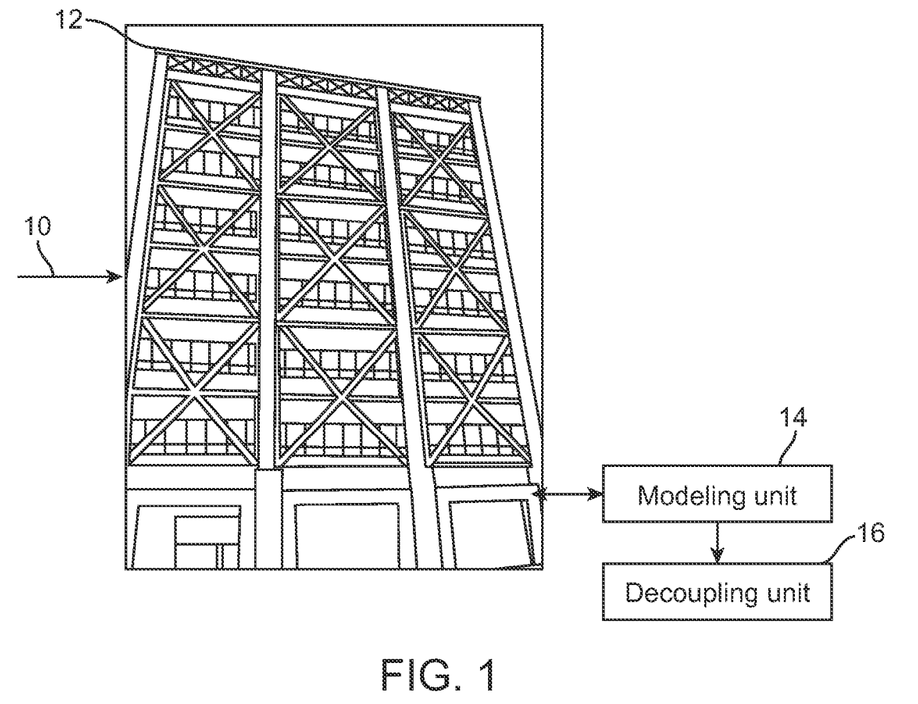
FIG. 1 illustrates one of many applications of a decoupling unit, in accordance with an embodiment of the present invention.

Referring now to FIG. 1, one of many applications of a decoupling unit is shown, in accordance with an embodiment of the present invention, some of which are enumerated above. More particularly, in FIG. 1, a physical system 12 (in the form of a multi-story building) is shown to be sensed by a third-party modeling unit 14, which is shown in communication with a decoupling unit 16. Building 12 is an example of a physical structure whose dynamic behavior can be modeled by a linear dynamical system. Another example of a physical structure whose dynamic behavior can be modeled by a linear dynamical system is a bridge. Further important examples are listed above and include, without limitation, cars, satellites and electric circuits. The list of examples is too long to enumerate herein, but can be contemplated by those of ordinary skill in the art. As previously indicated, the method and apparatus of this invention is applicable to all physical or electrical structures for which a linear dynamical system model can be generated by the modeling 14.

Building 12 is acted upon by external forces such as, without limitation, those associated with high winds, earthquakes or sea waves. In FIG. 1, these forces 10 are applied to the building 12 in the form of wind, for example, from the side of the building (as shown in FIG. 1) or in the form of an earthquake, for example, from the bottom of the building.

While only a sub-set of applications of the decoupling unit 16 are presented herein, many other applications, too numerous to list herein are contemplated.

Figure 8A:
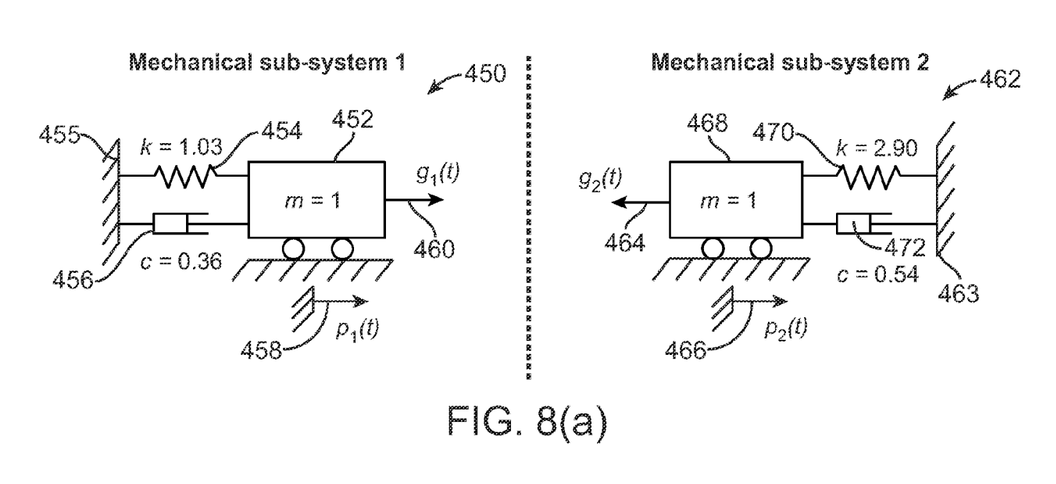
Figure 8B:
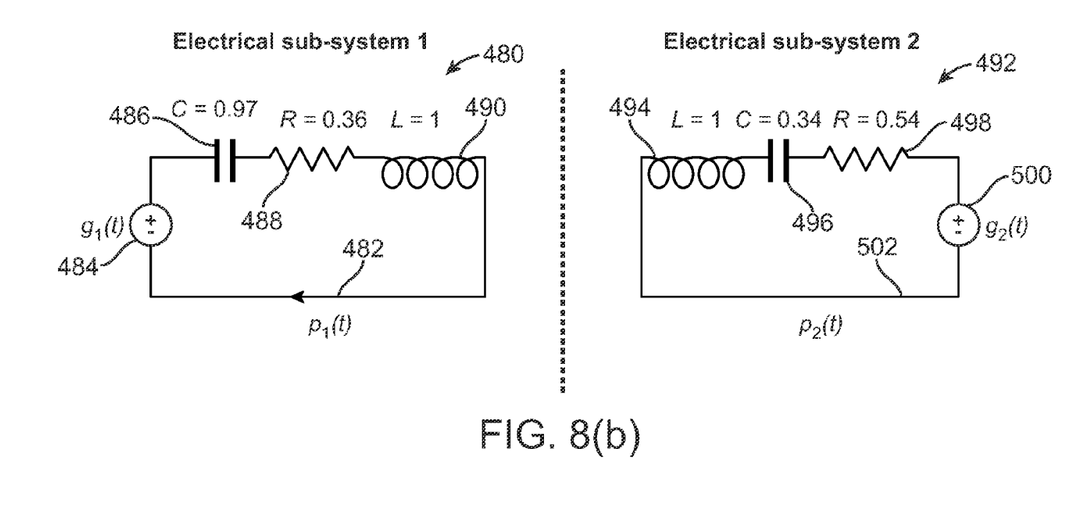

The modeling unit 14, among other tasks, generates equations of motions that are ultimately used by the decoupling unit 16. The modeling unit 14 senses the building 12 and models the forces 10 being applied thereto by generating the governing equations in terms of material parameters and external excitation, using procedures known to those of ordinary skill in the art. Once the governing equations of a linear system are generated by the modeling unit 14, dynamic properties of the system can be derived subsequently from the equations. For mechanical systems, the third-party modeling unit 14 may be a discretization scheme in finite element software (program). For electrical circuits, the modeling unit 14 may be a set of procedures for assigning values of inductances, resistances and capacitors. An example of a model of a mechanical system that is generated by the modeling unit 14, in accordance with an embodiment of the present invention, is presented and discussed relative to FIG. 8(*a*). Similarly, an example of a model of an electrical system that is generated by the modeling unit 14, in accordance with an embodiment of the present invention, is presented and discussed relative to FIG. 8(*b*).

Focusing now on mechanical systems, the material parameters can be arranged in accordance with prior art techniques as three arrays (matrices), M, C and K. Here, and in accordance with notation in the art, bold letters denote arrays of numbers, or matrices. The matrices M, C and K are referred to herein as "material parameters". The force 10 (or f(t)) acting on the physical structure, such as the building 12 is referred to herein as "external excitation". These input parameters, in part, form Eq. (1) below, which represents the coupled linear dynamical system. The matrix M contains the inertial (mass) properties of building 12, C contains the properties of energy dissipation in the form of viscous damping, and K contains the elastic (stiffness) properties of the building 12. Based upon the theory of Lagrangian dynamics and imposing the usual physical constraints (for example the system is not a runaway system and damping can be treated as equivalent viscous damping which dissipates energy), the matrices M, C and K are real, symmetric and positive definite. The model of forces generated by the modeling unit 14 is also arranged as an array of real numbers denoted by f(t). In one embodiment of the present invention, this array f(t) is stored in a parameter storage unit (shown in FIG. 4).

As explained earlier, a linear dynamical system is represented by a set of second-order ordinary differential equations. However, a set of equations can be written in a compact form as a matrix equation, as follows:

$$M\ddot{q}(t)+C\dot{q}(t)+Kq(t)=f(t).$$  Eq. (1)

In the above equation, $q(t)=[q_1(t)\ q_2(t)\ \ldots\ q_n(t)]^T$ is a real column vector whose elements represent the time-varying displacements of various components of the physical structure under observation (such as building 12) from their equilibrium positions. It is customary to refer to Eq. (1) as a linear dynamical system. In Eq. (1) and those other equations shown herein, a "dot" above the vector q(t) denotes a derivative with respect to time. In mechanical systems, $\dot{q}(t)$ and $\ddot{q}(t)$ therefore represent the velocity and acceleration of the structure. If there are n individual equations in Eq. (1), the system is said to have n degrees of freedom. In this case, M, C and K are symmetric and positive definite of order n and f(t) is an n-dimensional column vectors. If external forces are absent, f(t)=0 and Eq. (1) is said to be in free vibration; otherwise the system is in forced vibration. To those of ordinary skill in the art, it is known that a complete description of Eq. (1) also requires the specification of a set of initial values q(0), $\ddot{q}$(0). These initial values are supplied by the modeling unit 14.

In general, individual equations in Eq. (1) are interlinked or coupled so that they cannot be treated independently of each other. In terms of matrices, individual equations in Eq. (1) are coupled unless all three matrices M, C and K are diagonal. To decouple the equations, the decoupling unit 16 transforms a system specified by Eq. (1) into a system specified by a modified set of linear second-order ordinary differential equations, represented by a matrix equation in the following form:

$$\ddot{p}(t)+D_1\dot{p}(t)+\Omega_1 p(t)=g(t).$$  Eq. (2)

In the above equation, p(t), g(t) are n-dimensional column vectors and the matrices $D_1$, $\Omega_1$ are real and diagonal. Because $D_1$, $\Omega_1$ are diagonal, all individual equations in Eq. (2) are mutually independent and each can be analyzed or solved without considering the other equations. The modified set of decoupled equations in Eq. (2) also models and predicts the dynamic behavior of the physical structure under observation (such as building 12) and is termed the decoupled linear dynamical system or decoupled system, for short.

In accordance with an embodiment of the present invention, the decoupled system, generated by the decoupling unit 16, is used to analyze the vibration characteristics of building 12. Of particular relevance are: (1) the simplification in using analytical techniques in evaluating and predicting the dynamic behavior of building 12 in terms of independent decoupled equations, for reason that each individual equation can be examined (to determine stability and long-term reliability for example) without considering other equations; and (2) the improvement in efficiency using numerical algorithms for the same tasks. For example, the decoupled equations, generated by the decoupling unit 16, can be readily solved using parallel computer architecture, thus economizing in core memory and computing time. The improvement in efficiency in response calculation by method of decoupling, exemplified in FIG. 6, will be discussed shortly. More than an improvement in efficiency, new possibilities exist in simplifying the design process with decoupling. As explained previously, an investigation of the distribution of energy among the independent equations leads to modal reduction, with which a complex structure can be realistically represented by far fewer individual equations. The simplified model after modal reduction contains only higher-energy sub-systems essential for design. These are, without limitation, some of the advantages offered by the decoupling unit 16. Indeed, the method and apparatus of the present invention greatly streamline the evaluation and design of linear dynamical systems.

Figure 2:
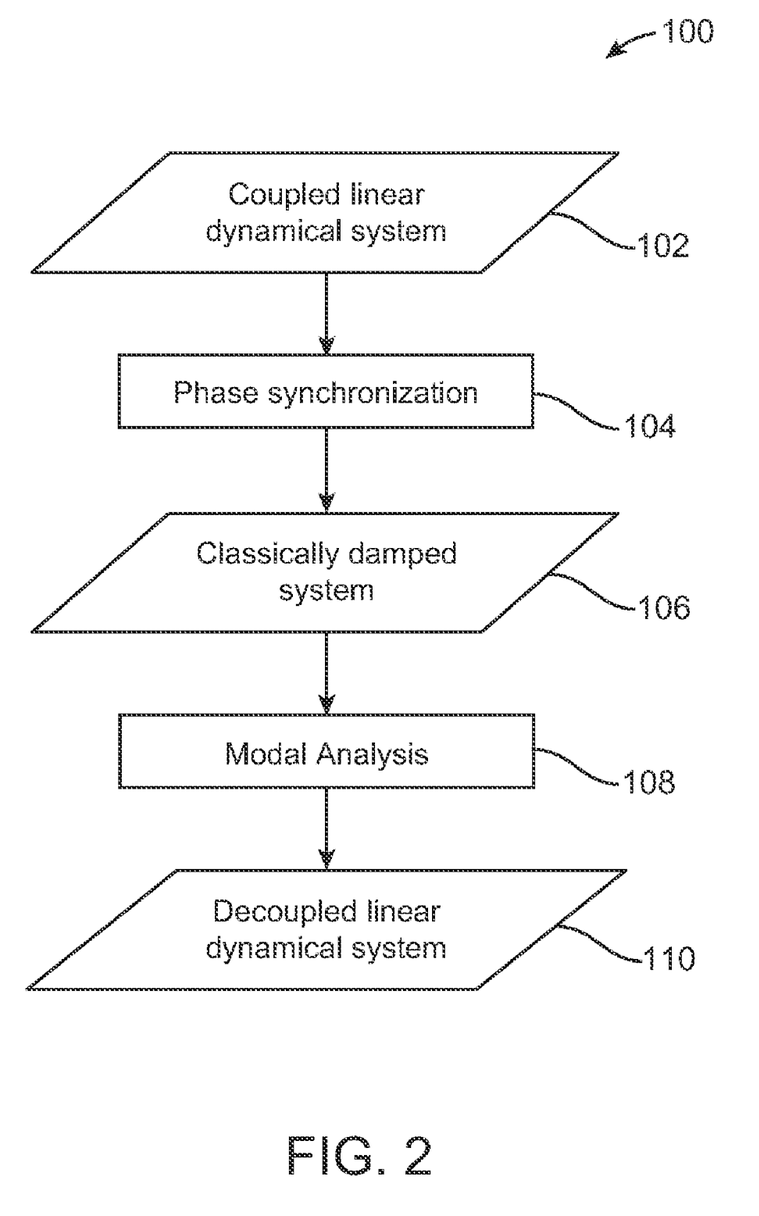
FIG. 2 shows the steps performed by the decoupling unit 16 and the results of each step, in accordance with the various embodiments of the present invention.

FIG. 2 shows the steps performed by the decoupling unit 16 and the results of each step, in accordance with the various embodiments of the present invention. In FIG. 2, parallelograms represent inputs and outputs and rectangles represent steps. Initially, a coupled linear system 102, as specified by Eq. (1), is provided as input at step 104. In FIG. 2, the coupled linear system 102 includes the material parameters and the external excitation.

At step 104, phase synchronization of the damped modes of vibration is performed in a manner described in Appendices A and B, resulting in a classically damped system 106. In other words, the step 104 of FIG. 2 performs the step of determining the non-classically damped modes of vibration from the solutions of the quadratic eigenvalue problem. Details of doing so are shown as steps 126 and 128 in FIG. 3. Subroutines 202 and 204 of FIGS. 4 and 5, which are executed by the decoupling processor 11, perform the foregoing determining step. As explained in Appendices A and B, a classically damped system is one that can be decoupled by classical modal analysis. The classically damped system 106 is then provided as input to step 108, where modal analysis is indeed applied to convert the classically damped system 106 into a decoupled linear dynamic system (sometimes referred to herein as the "decoupled system") 110. The decoupled system 110 is represented in equation form by Eq. (2).

Some background to allow further understanding of FIG. 2 is now presented. To those of ordinary skill in the art, it is known that a uniformly damped physical structure can be decoupled by modal analysis. In other words, using the terminology as explained previously, a uniformly damped physical structure is classically damped. It is also recognized that the free vibration of a uniformly damped physical structure is the superposition of a number of independent and observable vibration patterns, termed classical normal modes. In each classical normal mode, all system components perform harmonic vibration with identical frequency and with the same rate of exponential decay in amplitudes. The motion is truly synchronous in the sense that various components of the system are either in phase or out of phase with each other, and they pass through their equilibrium positions at the same instant of time. When damping is not uniform, classical normal modes cannot be observed because such vibration patterns no longer exist. To those of ordinary skill in the art, it is recognized that non-uniform damping is not classical damping and thus a non-uniformly damped system cannot be decoupled by modal analysis.

In experimental testing of mechanical and electrical systems, it was observed by the inventors that certain patterns of vibration that were more complicated than classical normal modes existed in the free vibration of systems with non-uniform damping. These patterns were termed non-classically damped modes. In each non-classically damped mode of vibration, all system components still performed harmonic vibration with identical frequency and with the same rate of exponential decay. However, the system components did not pass through their equilibrium positions at the same time and the motion appeared disorganized. Nonetheless, the phase difference between any two components was constant and the order in which the system components passed through their equilibrium positions remained unchanged. After one complete cycle the components returned to positions separated by the same phase angles as in the beginning of the cycle. There indeed existed an unchanging pattern from cycle to cycle, but the pattern was not as easy to recognize as a classical normal mode. When a system with non-uniform damping was tuned so that the phase differences between various components in each non-classically damped mode vanished, each non-classically damped mode became identical in pattern to a classical normal mode. The tuned system could then be decoupled. An easy avenue to achieve this state in which a system could be decoupled was to tune the system so that the phase angles of all components in any non-classically mode are zero. The process thus created was referred to as phase synchronization, performed by step 104 of FIG. 2.

To be sure, only simple (with a few degrees of freedom) vibrating systems can be tuned experimentally to a state in which they can be decoupled. Thus a thorough development must be made in order to decouple all linear systems of the form given by Eq. (1). Further details of and a rather elaborate development of the methodology of decoupling by phase synchronization, based upon logical deductions, is shown in Appendices A and B herein. Appendices A and B provide development of the decoupling methodology based upon rigorous mathematical deductions, which also justify the robustness of the various embodiments of the present invention.

Phase synchronization amounts to constructing a time-varying transformation on Eq. (1) so that the phase angles in each non-classically damped mode are made to vanish. After the transformation, Eq. (1) is classically damped and the system can be decoupled by modal analysis at step 108 of FIG. 2. In addition, development of the method, and apparatus of the embodiments of the invention involves a "detuning" process, which is the development of an inverse time-varying transformation taking the decoupled system, its response or other properties, back to those of the original one. In Appendices A and B, the process of phase synchronization and both the forward and inverse decoupling transformations are developed by rigorous mathematical deductions in order to establish general utility of the method and apparatus of the present invention.

The key steps in the implementation of the methodology of decoupling by phase synchronization will now be described. A numerically efficient realization of the method is certainly an implicit consideration. Starting with the coupled Eq. (1), solution of the quadratic eigenvalue problem $$(M\lambda^2 + C\lambda + K)v = 0 \quad \text{Eq. (3)}$$

is sought at step 104 in FIG. 2. All parameters needed to achieve decoupling are contained in the solution of the above algebraic equation and no other equations are required to be solved. Let $$\lambda_j = \alpha_j + i\omega_j, \quad \text{Eq. (4)}$$

$$v_j = [r_{j1} e^{-i\phi_{j1}} r_{j2} e^{-i\phi_{j2}} \ldots r_{jn} e^{-i\phi_{jn}}]^T \quad \text{Eq. (5)}$$

constitute a solution of Eq. (3), where $j=1, \ldots, n$, and n is the number of degrees of freedom. To those of ordinary skill in the art, such a solution can be readily computed. It is also recognized that, in agreement with notation in the art, $i=\sqrt{-1}$ and the superscript T denotes the transposition of a vector or matrix. The scalar quantity $\lambda_j$ of Eq. (4) is termed an eigenvalue and the vector $v_j$ of Eq. (5) an eigenvector associated with $\lambda_j$. It is known from prior art that there are 2n eigenvalues and 2n corresponding eigenvectors. As established in Appendices A and B, when cast in the form given by Eqs. (4) and (5), every solution of Eq. (3) has the property that $\alpha_j$ is negative, $\omega_j$ is either real or purely imaginary, and $r_{jk}$, $\phi_{jk}$ (j, k=1, ..., n) are real or complex. A non-classically damped mode associated with the solution depicted in Eqs. (4) and (5), has the form (Section 4 of Appendix A and Section 4.3 of Appendix B)

$$s_j(t) = C_j e^{\alpha_j t} \begin{bmatrix} r_{j1} \cos(\omega_j t - \theta_j - \varphi_{j1}) \\ r_{j2} \cos(\omega_j t - \theta_j - \varphi_{j2}) \\ \vdots \\ r_{jn} \cos(\omega_j t - \theta_j - \varphi_{jn}) \end{bmatrix}, \quad \text{Eq. (6)}$$

where the constants $C_j$, $\theta_j$ depend on the initial values $q(0)$ and $\dot{q}(0)$. As explained previously, a non-classically damped mode can be observed in free vibration. If damping is light, Eq. (6) manifests itself as harmonic vibration of the system components. If damping is heavy, $\omega_j$ are purely imaginary (Sections 4.1 and 4.3 of Appendix B) so that Eq. (6) manifests itself as exponential decay without oscillations. In free vibration, for which $f(t)=0$, phase synchronization at step 104 is achieved by a time-shifting transformation (Eq. (33) in Appendix A) which makes $\phi_{j1}=\phi_{j2}=\ldots=\phi_{jn}=0$ for $j=1, \ldots, n$, i.e. for all non-classically damped modes. The effect of this transformation is to convert Eq. (1) into an intermediate system, classically damped system 106, which is classically damped. This intermediate system is then decoupled by modal analysis at step 108 to produce a decoupled system, specified by Eq. (2), as decoupled linear dynamical system 110. In some embodiments, the operations of steps 104 and 108 are performed as two independent processes, as shown in FIG. 2, in other embodiments, the two operations of steps 104 and 108 are combined into a single overall time-shifting transformation (Eq. (23) discussed later or Eq. (54) in Appendix A).

In forced vibration, for which $f(t) \neq 0$, phase synchronization is achieved by a time-varying transformation which is an extension of the time-shifting transformation applicable to free vibration. The overall time-varying transformation compensates for time drifts caused by both damping and the external force f(t), taking the coupled Eq. (1) into the decoupled Eq. (2) as decoupled linear dynamical system 110 (Eq. (22) discussed later or Eq. (86) in Appendix B). The process of decoupling by phase synchronization is invertible, and a time-varying transformation taking the decoupled system or its response back to the original system (1) or its response is determined in Appendices A and B. In algorithmic development, the various steps in the high-level conceptual flowchart of FIG. 2 can be combined in a single processor for efficient operation.

Figure 3:
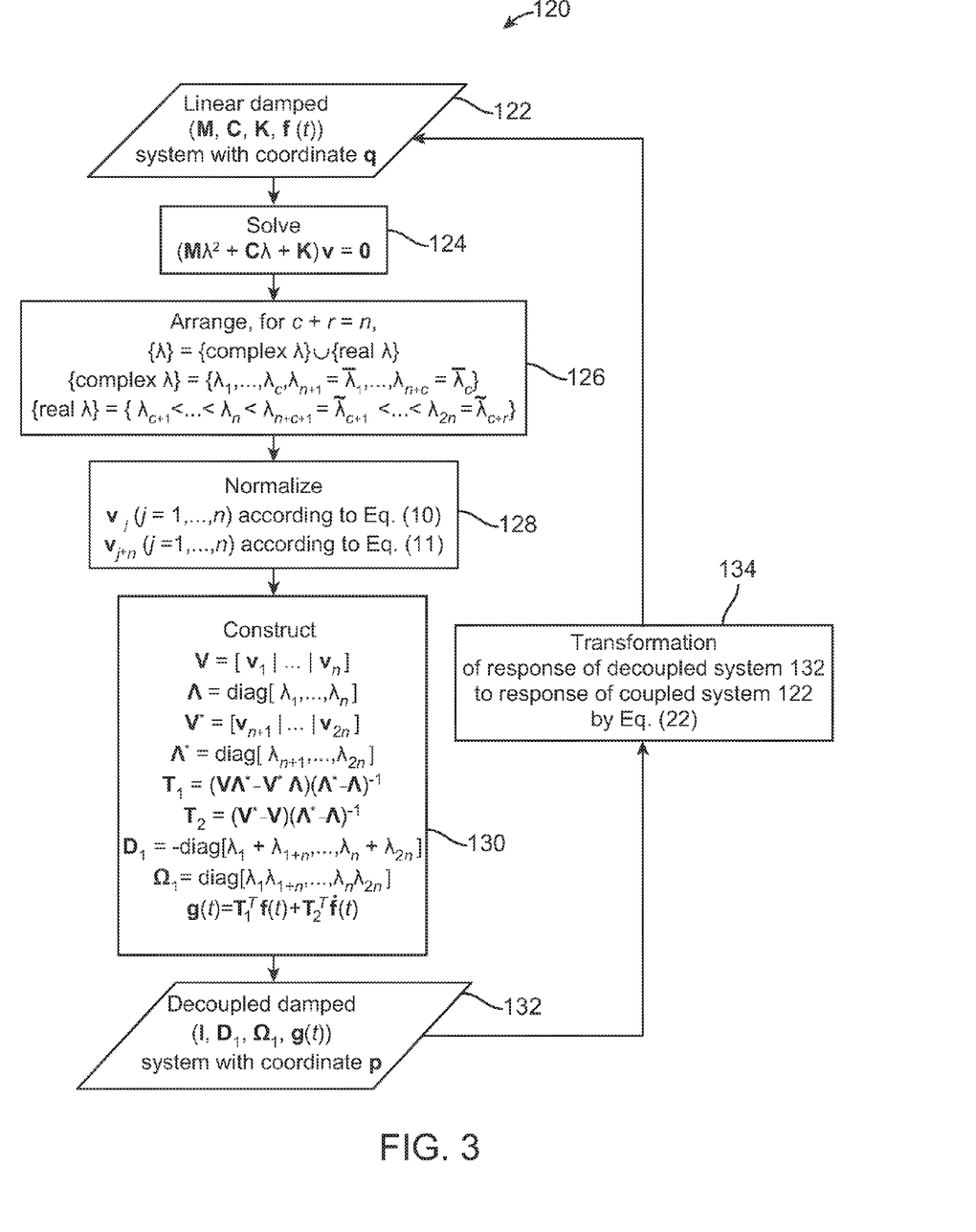
FIG. 3 shows a high-level flowchart of the steps performed during the phase synchronization 104 and modal analysis 108 steps of FIG. 2.

Referring to FIG. 3, a high-level flowchart is shown of the steps performed during the phase synchronization 104 and modal analysis 108 steps of FIG. 2. Specifically, FIG. 3 describes how the steps 104 and 108 of FIG. 2 are efficiently combined and executed. In this manner, combining steps 104 and 108 of FIG. 2 is advantageously accomplished by steps shown in FIG. 3. This is important in improving the efficiency of the various processes of the present invention.

In FIG. 3, parallelograms denote inputs or output(s) and rectangles denote steps. A coupled system 122 in FIG. 3 is provided as input to step 124. In FIG. 3, the coupled linear system 122, which is the same as coupled linear system 102 of FIG. 2, includes the material parameters and the external excitation. At step 124, the quadratic eigenvalue problem associated with the linear dynamical system is solved.

Let 2c eigenvalues be assumed complex and 2r=2n−2c be assumed real. At step 126, the eigenvalues are separated into two disjoint sets such that $$\{\lambda\}=\{\text{complex }\lambda\}\cup\{\text{real }\lambda\}. \quad \text{Eq. (7)}$$

The 2c complex eigenvalues occur as c pairs of complex conjugates and index these eigenvalues in such a way that $$\{\text{complex }\lambda\}=\{\lambda_1,\ldots,\lambda_c,\lambda_{n+1}=\bar{\lambda}_1,\ldots,\lambda_{n+c}=\bar{\lambda}_c\}. \quad \text{Eq. (8)}$$

Arrange the 2r eigenvalues in increasing order and index them such that $$\{\text{real }\lambda\}=\{\lambda_{c+1}<\ldots<\lambda_n<\lambda_{n+c+1}=\tilde{\lambda}_{c+1}<\ldots<\lambda_{2n}=\tilde{\lambda}_{c+r}\}. \quad \text{Eq. (9)}$$

At step 128, the corresponding eigenvectors are normalized in accordance with $$2\lambda_j v_j^T M v_j + v_j^T C v_j = \lambda_j - \lambda_{j+n}, \quad \text{Eq. (10)}$$

$$2\lambda_{j+n} v_{j+n}^T M v_{j+n} + v_{j+n}^T C v_{j+n} = \lambda_{j+n} - \lambda_j \quad \text{(Eq. 11)}$$

for j=1, . . . , n. At step 130, the following matrices are assembled:

$$V=[v_1|\ldots|v_n], \quad \text{Eq. (12)}$$

$$\Lambda=\text{diag}[\lambda_1,\ldots,\lambda_n], \quad \text{Eq. (13)}$$

$$V^*=[v_{n+1}|\ldots|v_{2n}], \quad \text{Eq. (14)}$$

$$\Lambda^*=\text{diag}[\lambda_{n+1},\ldots,\lambda_{2n}], \quad \text{Eq. (15)}$$

$$T_1=(V\Lambda^*-V^*\Lambda)(\Lambda^*-\Lambda)^{-1}, \quad \text{Eq. (16)}$$

$$T_2=(V^*-V)(\Lambda^*-\Lambda)^{-1}. \quad \text{Eq. (17)}$$

Finally, using the eigenvalues from step 126, the excitation f(t) of the coupled system from step 122, and $T_1$, $T_2$ from Eqs. (16), (17), assemble as follows:

$$D_1=-\text{diag}[\lambda_1+\lambda_{n+1},\ldots,\lambda_n+\lambda_{2n}], \quad \text{Eq. (18)}$$

$$\Omega_1=\text{diag}[\lambda_1\lambda_{n+1},\ldots,\lambda_n\lambda_{2n}], \quad \text{Eq. (19)}$$

$$g(t)=T_1^T f(t)+T_2^T \dot{f}(t). \quad \text{Eq. (20)}$$

The decoupled system 132, which is the same as the decoupled system 110 of FIG. 2 and that can be constructed directly from Eqs. (18)-(20), is generated. As a result, the flowchart in of FIG. 3 takes a coupled system represented by Eq. (1) and converts it into a decoupled system represented by Eq. (2). The steps of FIG. 3 are rigorously justified by mathematical deductions in Appendices A and B. In FIG. 3, at step 130, transformation of the set of initial values for the original coupled equations of the linear dynamical system to a set of initial values for the independent decoupled equations modeling the same linear dynamical system is performed using the following equation:

$$\begin{bmatrix} p(0) \\ \dot{p}(0) \end{bmatrix} = \begin{bmatrix} I & I \\ \Lambda & \Lambda^* \end{bmatrix} \begin{bmatrix} V & V^* \\ V\Lambda & V^*\Lambda^* \end{bmatrix}^{-1} \begin{bmatrix} q(0) \\ \dot{q}(0) \end{bmatrix} + \begin{bmatrix} 0 \\ T_2^T f(0) \end{bmatrix}. \quad \text{Eq. (21)}$$

At step 134, the set of independent decoupled equations (or decoupled equation), Eq. (1), associated with the decoupled system is solved. Further performed at this step is transformation of the solution of the decoupled system to the solution of the original coupled system by using the following equation:

$$q(t)=T_1 p(t)+T_2 \dot{p}(t)-T_2 T_2^T f(t). \quad \text{Eq. (22)}$$

Figure 5:
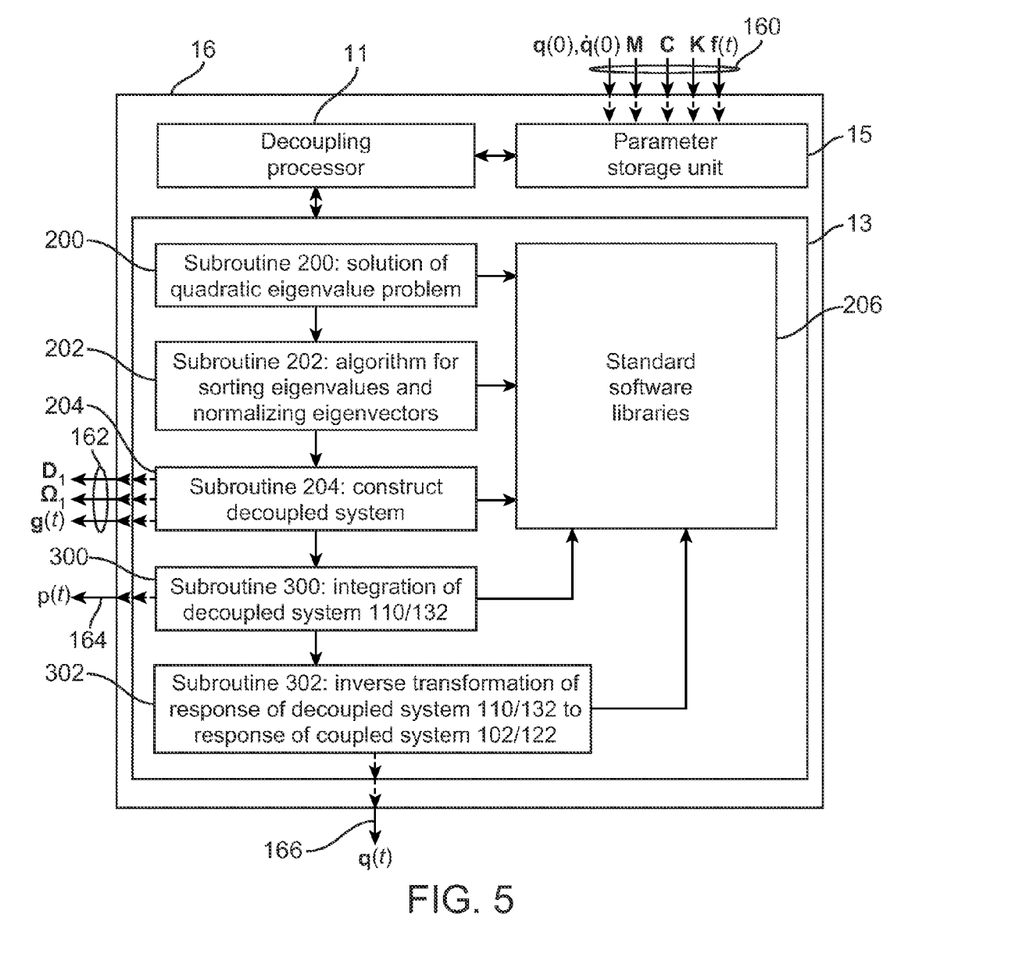
FIG. 5 shows a high-level block diagram of a decoupling unit 16, in accordance with another embodiment of the present invention.

Step 134 is executed by the subroutines 300 and 302 of FIG. 5 by the decoupling processor 11 with response of the decoupled system as output 164 and solution of the original coupled system as output 166.

In the above description of FIG. 3, it has been assumed that the eigenvalue problem represented by Eq. (3) is not defective. This is true with probability one for randomly chosen eigenvalue problems, i.e. for almost any practical application. Nevertheless, the method of decoupling by phase synchronization is also valid when Eq. (3) is defective, with minor changes to the functional forms of g(t) and Eqs. (22), (23). This purely theoretical issue has been addressed in Appendices A and B.

It is noted in FIG. 3, that step 126 follows step 124, step 128 follows step 126 and step 130 follows step 128. In addition, step 134 uses the output at step 132.

In an exemplary embodiment of the present invention, the process for decoupling by phase synchronization is implemented by execution of a software program. A programming language such as, without limitation, C, C++, Fortran or Matlab can be used. The code can be stored in the code storage unit 13 (shown in FIG. 4) and executed by a decoupling processor 11 (also shown in FIG. 4). In another embodiment, the code is stored on a computer accessible medium and executed by third-party software packages, for example by finite element packages. Other embodiments, too numerous to enumerate herein, are contemplated.

Thus, in a manner consistent with the various methods of the present invention, using the decoupling unit 16, a method is presented for improving analysis and design of a physical structure whose dynamic behavior can be modeled as a linear dynamical system.

Figure 4:
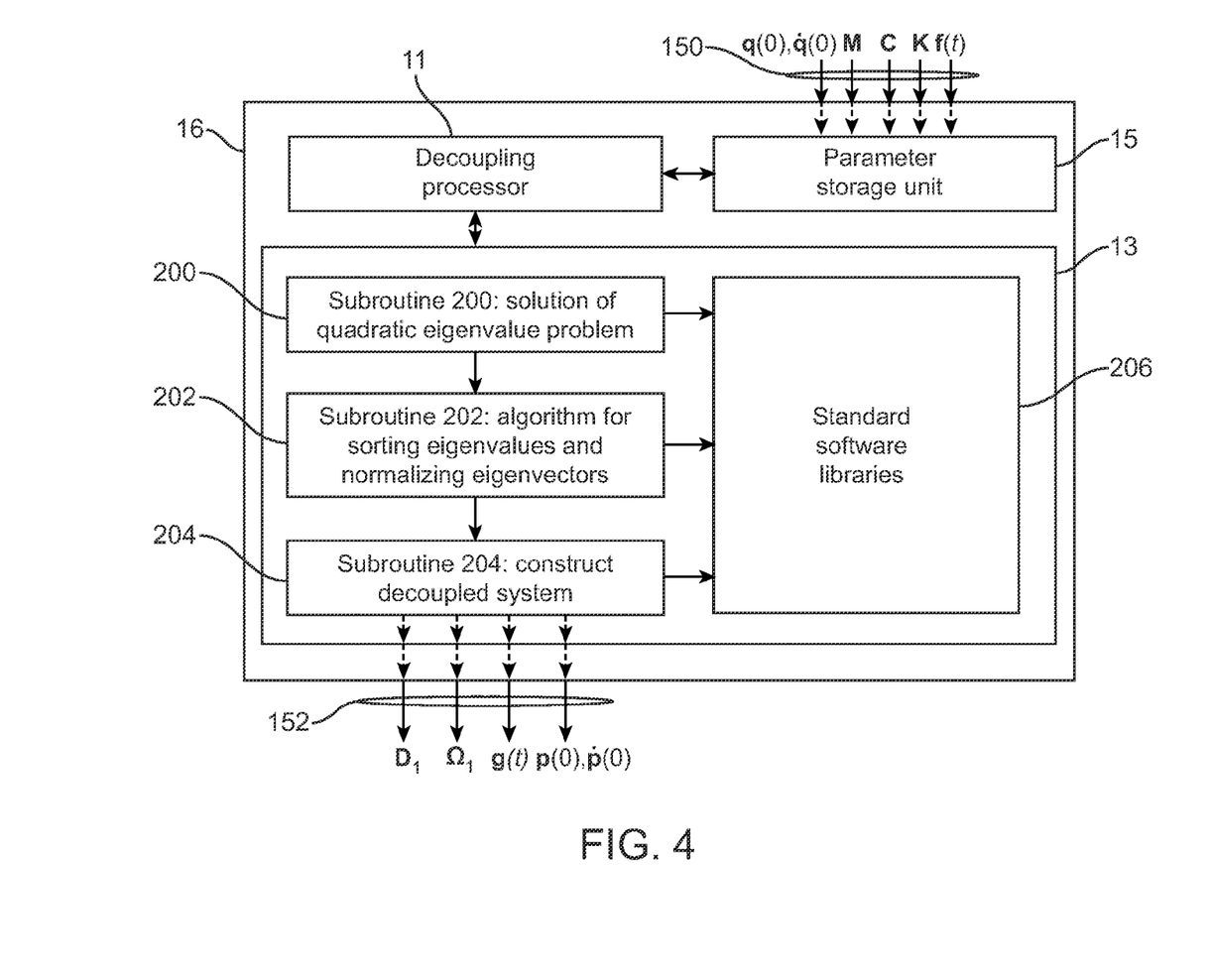
FIG. 4 shows a high-level block diagram of the decoupling unit 16 of FIG. 1, in accordance with an embodiment of the present invention.

FIG. 4 shows a high-level block diagram of the decoupling unit 16 of FIG. 1, in accordance with an embodiment of the present invention. The decoupling unit 16, in FIG. 4 is shown to include a decoupling processor 11, a parameter storage unit 15 and a code storage unit 13, in accordance with an embodiment of the present invention. The code storage unit 13 may be, for example and without limitation, a hard disk, flash memory, a compact disk (CD), digital video disk (DVD) or any other computer-accessible media. The parameter storage unit 15 may be, for example and without limitation, read-write access memory (RAM), a hard drive or any other computer-accessible medium. In certain applications, the code storage unit 13 and the parameter storage unit 15 may be the same device, for example a hard disk and internal memory.

In FIG. 4, the inputs 150 are material parameters and external excitation and are stored in the parameter storage unit 15. The decoupling processor 11 accesses the parameter storage unit 15 and transfers parameters from the parameter storage unit 15 to subroutines 200, 202 and 204. The decoupling processor 11 first passes the inputs 150 to subroutine 200. The decoupling processor 11 then accesses the results of subroutine 200, stores them in the parameter storage unit 15 and then passes them to subroutine 202. The results of subroutine 202 are accessed by the decoupling processor 11, which passes them to the parameter storage unit 15 and to subroutine 204. The results of subroutine 204 are accessed by the decoupling processor 11 and transferred to the parameter storage unit 15. When the decoupling processor 11 executes subroutines 200, 202 and 204, they call standard software libraries 206, for example for matrix multiplication, addition, and the like.

The decoupling processor 11 is coupled to the code storage unit 13 and to the parameter storage unit 15. Solution subroutines 200, sorting subroutine 202, construct subroutine 204 and various standard software libraries 206 are stored in the code storage unit 13. The decoupling processor 11 transfers data from the parameter storage unit 15 to code storage unit 13 and executes subroutines 200 and 202 to manipulate the data. The subroutines 200, 202 may call third-party libraries 206. The input 150 to the decoupling unit 16 (and more particularly to the parameter storage unit 15) includes matrices M, C, K, f(t), as well as the initial values $q(0)$, $\dot{q}(0)$, and all input data are stored in the parameter storage unit 15.

The output 152 of the decoupling unit 16, which is generated by execution of the subroutine 204 by the decoupling processor 11, includes the matrices $D_1$, $\Omega_1$, g(t), p(0) and $\dot{p}(0)$, which are either stored in the parameter storage unit 15 or transferred to other third-party subroutines. An example of third-party subroutine is an integration algorithm for computing the response p(t) of the decoupled system. A description of the software implementation is as follows.

The decoupling processor 11 accesses the parameter storage unit 15 and passes the arrays M, C and K to subroutine 200 in which the quadratic eigenvalue problem, as represented by Eq. (3), is solved. In other words, the subroutine 200 of FIG. 4, upon execution by the decoupling processor 11, solves the quadratic eigenvalue problem associated with the linear dynamical system. Specifically, subroutine 200 determines the 2n eigenvalues and corresponding 2n eigenvectors. Subroutine 200 may use a first-order reformulation of the quadratic eigenvalue problem followed by QZ or QR factorization or other suitable techniques known in the art. Numerical implementation of subroutine 200 will depend, among other things, on the accuracy desired by the user and the properties of M, C and K. For example, if M, C or K are sparse (as in some finite element applications), techniques that explore sparsity can be used. A pseudo code for subroutine 200 is provided below.

Pseudo Code for subroutine 200: Numerical solution of quadratic eigenvalue problem
Eig(M, C, K) {
  Use QR- or QZ-factorization of a linearized eigenvalue problem or other methods suitable to solve the quadratic eigenvalue problem of Eq. (3)
  return Eigenvalues $\lambda_1, \ldots, \lambda_{2n}$, Eigenvectors $v_1, \ldots, v_{2n}$
}

The decoupling processor 11 accesses the eigenvalues and eigenvectors and stores them in the parameter storage unit 15. The decoupling processor 11 then passes the eigenvalues and corresponding eigenvectors to subroutine 202. Subroutine 202 implements a process for sorting the eigenvalues and normalizing the eigenvectors as described earlier, namely by Eqs. (7)-(11). The process of Subroutine 202 is summarized as a pseudo code below.

Pseudo Code for subroutine 202: Rearrangement of eigenvalues and normalization of eigenvectors
SortAndNormalize(Eigenvalues, Eigenvectors){
  Detect complex eigenvalues and split the eigenvalues into two disjoint sets
  $\{\text{complex } \lambda\} = \{\lambda_1, \ldots, \lambda_c, \lambda_{n+1} = \overline{\lambda}_1, \ldots, \lambda_{n+c} = \overline{\lambda}_c\}$
  $\{\text{real } \lambda\} = \{\lambda_{c+1} < \ldots < \lambda_n \triangleleft \lambda_{n+c+1} < \ldots \triangleleft \lambda_{2n}\}$
  for j=1, ..., n
    tmp=$\sqrt{2\lambda_j v_j^T M v_j + v_j^T C v_j}$
    $v_j = v_j / \text{tmp} \cdot \sqrt{\lambda_j - \lambda_{j+n}}$
    tmp=$\sqrt{2\lambda_{j+n} v_{j+n}^T M v_{j+n} + v_{j+n}^T C v_{j+n}}$
    $v_{j+n} = v_{j+n} / \text{tmp} \cdot \sqrt{\lambda_{j+n} - \lambda_j}$
  end
  return normalized eigenvectors $v_1, \ldots, v_2$,
}

The eigenvalues, normalized eigenvectors and initial values of the linear dynamical system specified by Eq. (1) are passed onto subroutine 204 that upon execution thereof, causes construction of the decoupled system specified by Eq. (2). Execution of subroutine 204 further causes the matrices in Eqs. (12)-(17) to be assembled.

Efficient construction of the matrices V, V*, Λ, Λ*, $T_1$ and $T_2$ is straightforward for those of ordinary skill in the art. All matrices thus constructed are stored in the parameter storage unit 15. Subroutine 204 implements Eqs. (18)-(21) to generate the decoupled system 110/132, for which computation of the derivative of the external force f(t) is required. The derivative $\dot{f}(t)$ can be numerically approximated, for example, by finite differences. A pseudo code for subroutine 204 is provided below.

Pseudo Code for subroutine 204: Construction of decoupled system
ConstructDecoupledSystem(Eigenvalues, Eigenvectors){
  Construct matrices (arrays) in Eqs. (12)-(17)
  Compute decoupled system according to Eqs. (18)-(21)
  return DecoupledSystem $D_1$, $\Omega_1$, g(t), p(0), $\dot{p}(0)$
  return transformation matrices $T_1$, $T_2$
}

The decoupled system 110/132, specified by the matrices $D_1$, $\Omega_1$ and excitation g(t) and initial conditions p(0), $\dot{p}(0)$, is the output of subroutine 204 and output 152 of the decoupling unit 16. In the software implementation shown in FIG. 4, steps 104 and 108 have been combined into a numerically efficient procedure for decoupling as shown in the flowchart in FIG. 3. It is apparent that the flow of the subroutines can be modified, adapted or simplified in special cases. Implementation of the process executed by the decoupling processor 11 may also be streamlined by using subroutines from standard software libraries 206 such as LAPACK or EISPACK, known to those of ordinary skill in the art.

FIG. 5 shows a high-level block diagram of a decoupling unit 16, in accordance with another embodiment of the present invention. In contrast to FIG. 4, the decoupling unit 16 in FIG. 5 is configured to evaluate the response of a linear dynamical system through step 134 of FIG. 3. This configuration is achieved by adding response-computation subroutine 300 and transform subroutine 302 to the code storage unit 13. Subroutine 300 computes the response of the decoupled system while subroutine 302 transforms the decoupled response into the response associated with the original coupled system.

In FIG. 5, inputs 160 are the material parameters and external excitation. The decoupling processor 11 first passes the inputs 160 to subroutine 200, accesses the results, stores them in the parameter storage unit 15 and passes the results to subroutine 202. The decoupling processor 11 then accesses the results of subroutine 202, stores them in unit 15 and passes them to 204. The decoupling processor 11 then accesses the results of subroutine 204 and stores them in unit 15 (the process is analogous to that of FIG. 4 up until this point). The output of subroutine 204 is the decoupled system 110/132 and is also the output 162 of the decoupling unit 16. The decoupling processor 11 then takes the output of subroutine 204 and transfers it to subroutine 300. The decoupling processor 11 then accesses the results of subroutine 300 (output 164, response of decoupled system), stores them in unit 15 and passes them to subroutine 302. The output of subroutine 302 is the response of the original coupled system and is output 166 of the decoupling unit 16. As previously indicated, subroutines 200, 202, 204, 300 and 302 call standard software libraries 206 for example for matrix multiplication, addition, and the like. A detailed description of the software implementation is as follows.

During operation, the input 260, including the matrices M, C, K, f(t), and initial conditions q(0), q̇(0), are transferred to the new decoupling unit 16 of FIG. 5. Using subroutines 200, 202 and 204, the decoupling unit produces the decoupled system, specified by the arrays $D_1$, $\Omega_1$, p(0), ṗ(0) and g(t), in a manner similar to FIG. 4. The decoupled system and its initial conditions are stored in the parameter storage unit 15 and then passed to subroutine 300 for numerical or, in special cases, exact integration of Eq. (2). Subroutine 300 can be implemented using procedures known to those of ordinary skill in the art. For example, a suitable Runge-Kutta scheme can be used. The output 164 of the numerical integration, stored in unit 15, consists of the response p(t) of the decoupled system 110/132. In general, a scheme for numerical integration also provides the time derivative of p(t), stored in the array ṗ(t). If the derivative is not immediately available, it can be computed by prior art techniques (for example using finite differences) to produce the array ṗ(t). The arrays p(t) and ṗ(t) are passed into subroutine 302, which implements step 134 to generate the response q(t) of the original coupled system (1). The array q(t) can be stored in unit 15 or other computer-accessible media, or passed onto other subroutines for further analysis. It is apparent that the flow of the functions can be modified, adapted or simplified in special cases. For example, in free vibration of Eq. (1), f(t)=g(t)=0 and an exact solution of Eq. (2) can be implemented in subroutine 300. Furthermore, Eq. (22) associated with step 134 can be simplified to a time-shifting transformation of the form $$q(t) = \sum_{j=1}^{n} \text{diag}[p_j(t - \varphi_{j1}/\omega_j),$$
$$p_j(t - \varphi_{j2}/\omega_j), \ldots, p_j(t - \varphi_{jn}/\omega_j)]z_j \quad \text{Eq. (23)}$$

under free vibration (Section 5.2 of Appendix A for light damping and Section 4.4 of Appendix B for heavy damping), where $$z_j = [r_{j1}e^{\alpha_j\phi_{j1}/\omega_j} r_{j2}e^{\alpha_j\phi_{j2}/\omega_j} \ldots r_{jn}e^{\alpha_j\phi_{jn}/\omega_j}]^T \quad \text{Eq. (24)}$$

are also readily constructed from the solution of Eq. (3). Choice of the various subroutines, for example subroutine 200 for solution of the quadratic eigenvalue problem (3) or subroutine 300 for numerical or exact integration of the equations, will depend on the accuracy needed and the data structure adopted for the decoupling method. The implementation of the process for decoupling can be streamlined using standard software libraries 206 such as LAPACK or EISPACK.

Figure 6:
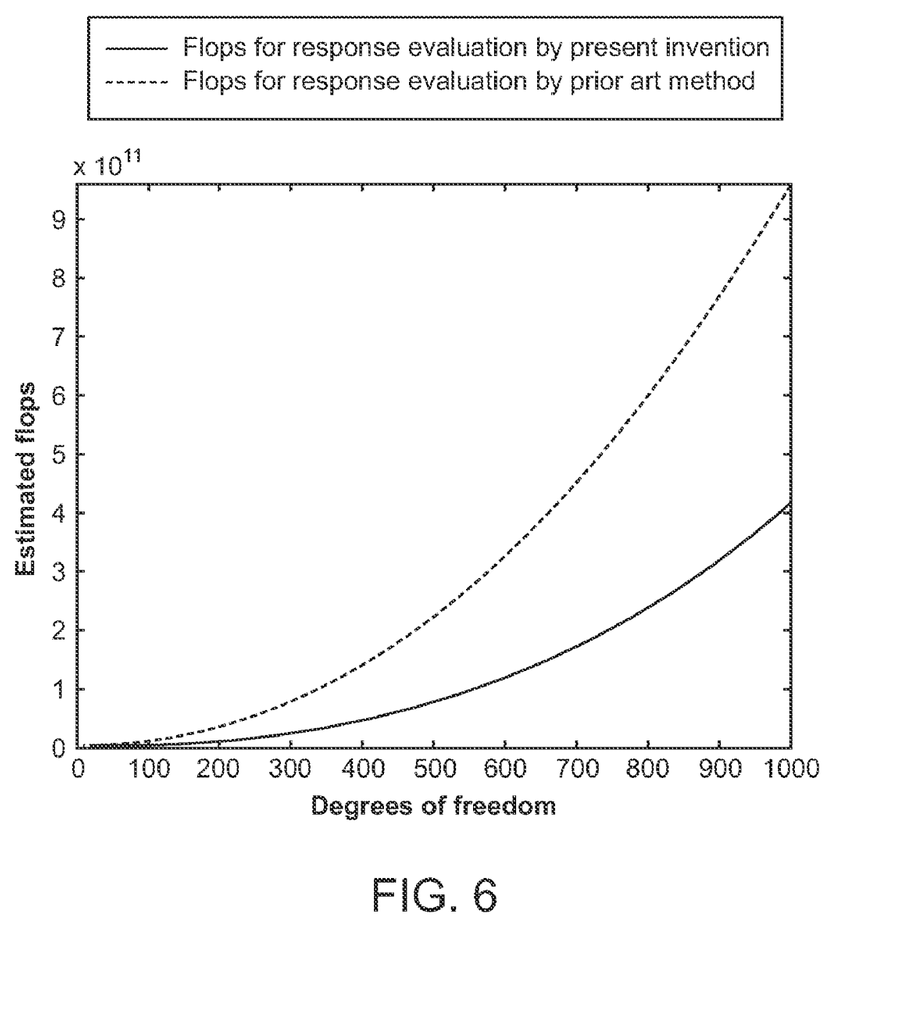
FIG. 6 shows a graph of the improvement in efficiency of response calculation realized in a decoupling embodiment or method of the present invention over that of prior art.

FIG. 6 shows a graph of the improvement in numerical efficiency in response calculation (simulation) by method and apparatus of the present invention over that of prior art. In FIG. 6, the x-axis represents the degrees of freedom and the y-axis represents an estimated number of floating point operations (flops). That is, typical improvement in efficiency of response calculation by the method of decoupling is depicted.

In accordance with prior art, the efficiency of the process is measured by the number of flops. In FIG. 6, the estimate of flops for response calculation using a popular prior art method is depicted as the dashed line and the estimate of flops for response calculation by the method of decoupling is depicted as a solid line. It is observed that response calculation by decoupling is more efficient than by prior art methods (Section 5.7 of Appendix A and Section 5.6 of Appendix B). Moreover, the improvement in efficiency becomes more pronounced as the degree of freedom increases, i.e. as the physical structure becomes more complex. In fact, FIG. 6 is rather conservative because the flops associated with response evaluation by the method of decoupling have been estimated using the same sampling interval for all independent decoupled equations. Taking into account the natural and driving frequencies of each decoupled equation, an optimal sampling interval can be individually chosen for each decoupled system. This strategy significantly decreases the flops associated with the method of decoupling, particularly when the frequencies of the decoupled systems are well separated and response over a large time window is required.

Figure 7A:
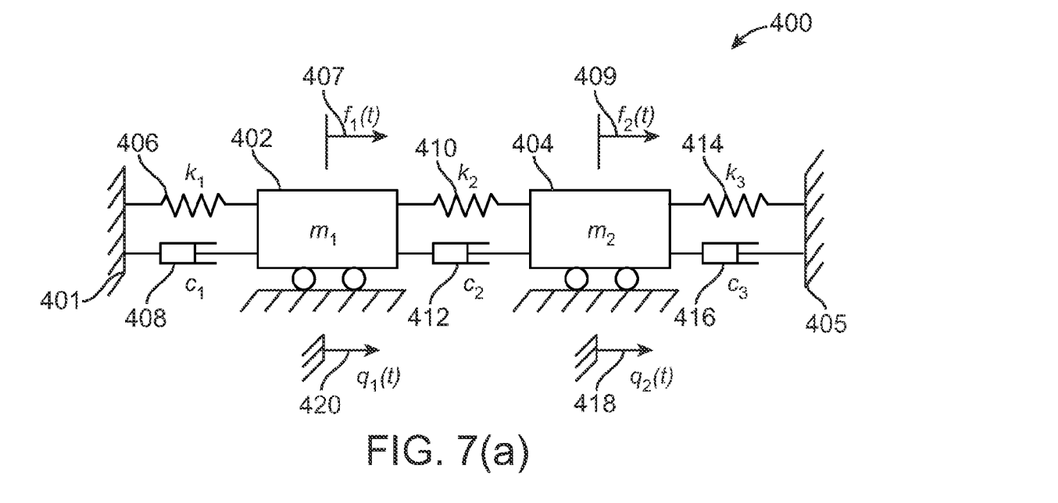
Figure 7B:
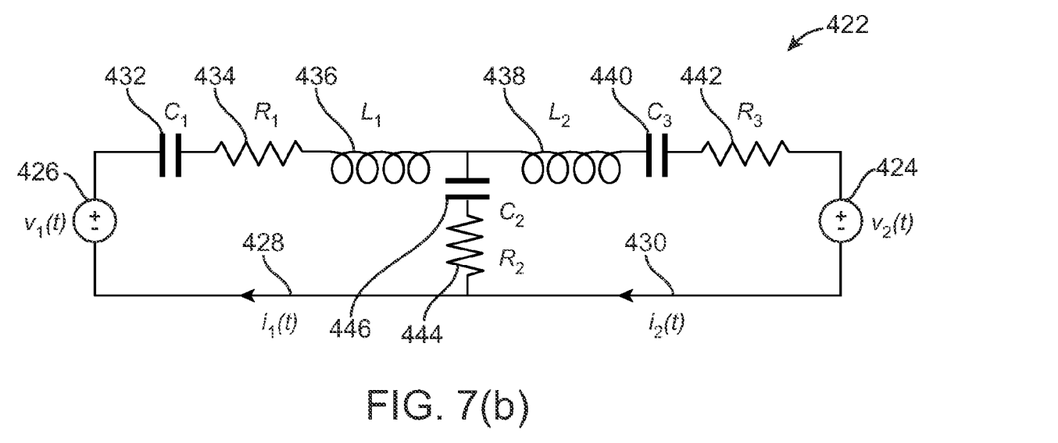

FIGS. 7(a) and 7(b) show a coupled system in two physically different but conceptually equivalent forms as a demonstration of utility and physical insight.

More particularly referring to FIG. 7(a), an example of a model of a coupled mechanical device 400, as determined by the modeling unit 14, is shown. In FIG. 7(a), the coupled mechanical device 400 is shown to include two sliding masses $m_1$ 402 and $m_2$ 404, three springs 406, 410 and 414 with respective spring constants $k_1$, $k_2$ and $k_3$, three dashpots 408, 412 and 416 with respective viscous damping constants $c_1$, $c_2$ and $c_3$, two rigid walls 401, 405, and external forces 407, 409. The displacements of the sliding masses 402, 404 are measured by the coordinates $q_1$(t) 420 and $q_2$(t) 418. In FIG. 7(a), the mechanical device 400 includes the material parameters and external excitation.

In FIG. 7(a), the spring 406 is shown connected in series with rigid wall 401 on one end and on the other thereof, the spring 406 is shown connected with the sliding mass 402. The dashpot 408 is shown coupled in parallel to spring 406 and connected in series with rigid wall 401 on one end and on the other thereof, the dashpot 408 is shown connected with the sliding mass 402. The end of sliding mass 402 that is not connected to spring 406 and dashpot 408 is connected in series to spring 410 and dashpot 412. The spring 410 is connected to sliding mass 402 on one end and on the other thereof is connected to sliding mass 404. The dashpot 412, which is in parallel connection to spring 410, is connected in series with sliding mass 402 on one end and to the other thereof is shown connected to sliding mass 404. The end of sliding mass 404 that is not connected to dashpot 412 and spring 410 is connected in series to spring 414 and dashpot 416. The spring 414 is connected to sliding mass 404 on one end and on the other thereof is connected to rigid wall 405. The dashpot 416, which is in parallel connection to spring 414, is connected in series with sliding mass 404 on one end and to the other thereof is shown connected to rigid wall 405. In this manner, two sliding masses are coupled such that a displacement 420 of sliding mass 402, causes a displacement 418 of sliding mass 404 and vice versa. The mechanical device is subject to external forces 407 and 409, which cause displacements 420 respectively 418 of sliding masses 402 respectively 404. In FIG. 7(a), $m_1$, $m_2$ represent respectively the masses of the sliding masses 402, 404; $k_1$, $k_2$ and $k_3$ represent respectively the spring constants of the linear springs 406, 410 and 414; $c_1$, $c_2$ and $c_3$, represent respectively the viscous damping constants of the dashpots 408, 412 and 416. In addition, $f_1(t)$, $f_2(t)$ represent respectively the external forces 407, 409 which act upon the sliding masses 402, 404. The modeling unit 14 generates the model, represented by Eq. (1), of the mechanical device 400 with $$M = \begin{bmatrix} m_1 & 0 \\ 0 & m_2 \end{bmatrix}, C = \begin{bmatrix} c_1 + c_2 & -c_2 \\ -c_2 & c_2 + c_3 \end{bmatrix},$$ Eq. (25)

$$K = \begin{bmatrix} k_1 + k_2 & -k_2 \\ -k_2 & k_2 + k_3 \end{bmatrix}, f(t) = \begin{bmatrix} f_1(t) \\ f_2(t) \end{bmatrix}.$$ Eq. (26)

FIG. 7(b) shows a model of a coupled electrical circuit 422, as determined by the modeling unit 14, as an exemplary model. In FIG. 7(b), the coupled electrical circuit 422 is shown to include two voltage supplies $v_1(t)$ 426 and $v_2(t)$ 422, capacitors $C_1$ 432, $C_2$ 436, $C_3$ 440, inductors $L_1$ 436, $L_2$ 438, resistors $R_1$ 434, $R_2$ 444, $R_3$ 442, and currents $i_1(t)$ 428, $i_2(t)$ 430.

In FIG. 7(b), the electrical device 422 includes the material parameters and external excitation. In FIG. 7(b), the capacitor 432 is shown coupled in series with the resistor 434 on one end and on the other thereof, the capacitor 432 is shown coupled to the voltage source 426. The end of the resistor 434 that is not coupled to the capacitor 432 is shown coupled to the inductor 436 and the inductor 436, on an end that is not coupled to the resistor 434 is shown coupled to the capacitor 446 and to the inductor 438. The capacitor 446, on an end not coupled to the inductor 436 is shown coupled to the resistor 444. The resistor 444, on an end that is not coupled to the capacitor 446 is shown couple to the voltage source 426 and to the voltage source 424. The voltage source is also shown coupled to the resistor 442. The resistor 442, on an end that is not coupled to the voltage source 424 is shown coupled to the capacitor 440 and the capacitor 440, on an end not coupled to the resistor 442, is shown coupled to the inductor 438. The inductor 438, on an end that is not coupled to the capacitor 440, is shown coupled to the capacitor 446 on an end of the capacitor 446 that is coupled to the inductor 436. In this manner, two closed loops are formed with one having current 428 pass therethrough and another having current 430 pass therethrough. In FIG. 7(b), $C_1$, $C_2$, $C_3$ represent respectively the capacitances of the capacitors 432, 436, 440; $L_1$, $L_2$ represent respectively the inductances of the inductors 436, 438; $R_1$, $R_2$, $R_3$ represent respectively the resistances of the resistors 434, 444 and 442.

The modeling unit 14 generates a model for the coupled electrical circuit in FIG. 7(b). The model is represented by Eq. (1) with $$M = \begin{bmatrix} L_1 & 0 \\ 0 & L_2 \end{bmatrix}, C = \begin{bmatrix} R_1 + R_2 & -R_2 \\ -R_2 & R_2 + R_3 \end{bmatrix},$$ Eq. (27)

$$K = \begin{bmatrix} 1/C_1 + 1/C_2 & -1/C_2 \\ -1/C_2 & 1/C_2 + 1/C_3 \end{bmatrix}, f(t) = \begin{bmatrix} v_1(t) \\ v_2(t) \end{bmatrix}.$$ Eq. (28)

For arbitrary values of the system parameters, the coupled systems in FIGS. 7(a) and 7(b) cannot in general be decoupled by modal analysis and other prior art techniques. To be specific, suppose the modeling unit 14 in FIG. 1 senses the following numerical values for the various parameters in Eqs. (25)-(28):

$$M = \begin{bmatrix} 1 & 0 \\ 0 & 1 \end{bmatrix}, C = \begin{bmatrix} 0.7 & -0.1 \\ -0.1 & 0.2 \end{bmatrix}, K = \begin{bmatrix} 2 & -1 \\ -1 & 2 \end{bmatrix},$$ Eq. (29)

$$f(t) = \begin{bmatrix} \cos(t) \\ \sin(2t) \end{bmatrix} q(0) = \begin{bmatrix} 1 \\ 2 \end{bmatrix}, \dot{q}(0) = \begin{bmatrix} -1 \\ 1 \end{bmatrix}.$$ Eq. (30)

It will be evident to those of ordinary skill in the art that this linear dynamical system cannot be decoupled by modal analysis or other methods of prior art because $CM^{-1}K \ne KM^{-1}C$. Using the method and apparatus of the present invention, a decoupled system represented by Eq. (2) is obtained, for which the following holds true:

$$D_1 = \text{diag}[0.36, 0.54],$$ Eq. (31)

$$\Omega_1 = \text{diag}[1.03, 2.90],$$ Eq. (32)

$$g(t) = \begin{bmatrix} g_1(t) \\ g_2(t) \end{bmatrix} = \begin{bmatrix} 0.72\cos t + 0.18\cos 2t + 0.09\sin t + 0.73\sin 2t \\ 0.74\cos t + 0.20\cos 2t - 0.10\sin t - 0.69\sin 2t \end{bmatrix},$$ Eq. (33)

$$p(0) = [2.32, -0.71]^T, \dot{p}(0) = [-0.43, -1.61]^T.$$ Eq. (34)

The two independent decoupled sub-systems associated with FIG. 7(a) are shown in FIG. 8(a), while the two decoupled sub-systems associated with FIG. 7(b) are shown in FIG. 8(b), in accordance with the embodiments of the present invention. That is, FIG. 8(a) shows the effects of the decoupling of the various methods of the present invention on the model of the mechanical device 400. Similarly, FIG. 8(b) shows the effects of the decoupling of the various methods of the present invention on the model of the circuit 422.

Decoupling of the coupled Eq. (1) of a linear dynamical system to generate decoupled Eq. (2) is performed at step 108 of FIG. 2 after conversion of Eq. (1) into a classically damped system 106. The foregoing step is also shown in somewhat greater detail at step 130 of FIG. 3 with the decoupled system as output 132 and shown to be a part of the subroutine 204, which is executed by the decoupling processor 11. The decoupled system 152 served as output and shown as the two independent sub-systems 450 and 462, specified by the decoupled Eq. (2) with parameters given by Eqs. (31)-(34) hereinabove, for modeling the coupled mechanical system 400 in FIG. 7(a). Similarly, the decoupled system 152 is shown as the two independent sub-systems 480 and 492, specified by the decoupled Eq. (2) with parameters as in Eqs. (31)-(34) hereinabove, for modeling the coupled electrical system 422 in FIG. 7(b).

More particularly referring to FIG. 8(a) the two decoupled sub-systems, mechanical sub-system 450 and mechanical sub-system 462, associated with the mechanical device 400 are shown. The model of the mechanical devices 450 and 462 are generated by the decoupling unit 16 in accordance with an embodiment of the present invention.

More specifically, FIG. 8(a) shows one of the two decoupled sub-systems, namely mechanical subsystem 450. The mechanical sub-system 450 is shown to include a sliding mass m 452, a spring 454 with linear spring constant k, a dashpot 456 with viscous damping constant c, a rigid wall 455 and an external force 460. The displacement of the sliding mass 452 is measured by the coordinate $p_1(t)$ 458. The spring 454 is shown connected to rigid wall 455 on one side and to the other thereof to sliding mass 452. The dashpot 456, which is in parallel connection to spring 454, is shown in series connection with rigid wall 455 on one side and to the other thereof with sliding mass 452. The external force 460 acts upon the sliding mass 452 and causes displacement 458 of sliding mass 452. The sliding mass 452 has mass m, the spring 454 has linear spring constant k and the dashpot 456 has a viscous damping constant c. The external force $g_1(t)$ 460 acts upon the sliding mass 452 and causes displacement $p_1(t)$ 458. For the mechanical device 400 with parameters as in Eq. (29) and (30), the decoupling unit 16 determines that m=1, c=0.36, k=1.03, and $g_1(t)$ is as given in Eq. (33).

FIG. 8(a) further shows the other of the two decoupled sub-systems, namely mechanical sub-system 462. The mechanical subsystem 462 is shown to include a sliding mass m 468, a spring 470 with linear spring constant k, a dashpot 472 with viscous damping constant c, a rigid wall 463 and an external force 464. The displacement of the sliding mass 468 is measured by the coordinate $p_2(t)$ 466. The spring 470 is shown connected to rigid wall 463 on one side and to the other thereof to sliding mass 468. The dashpot 472, which is in parallel connection to spring 470, is shown in series connection with rigid wall 463 on one side and to the other thereof with sliding mass 468. The external force 464 acts upon the sliding mass 468 and causes displacement 466 of sliding mass 468. The sliding mass 468 has mass m, the spring 470 has linear spring constant k and the dashpot 472 has a viscous damping constant c. The external force $g_2(t)$ 464 acts upon the sliding mass 468 and causes displacement $p_2(t)$ 458. For the mechanical device 400 with parameters given by Eqs. (29) and (30), the decoupling unit 16 determines that m=1, c=0.54, k=2.90, and $g_2(t)$ is as given in Eq. (33). The influence of displacement of mass 402 on displacement of mass 404 has been eliminated by decoupling in accordance with an embodiment of the present invention. In FIG. 7(a), a displacement 420 of sliding mass 402 always causes a displacement 418 of sliding mass 404 and vice versa. In the decoupled sub-systems 450, 462 of FIG. 8(a), a displacement 458 of the sliding mass 452 never causes a displacement 466 of the sliding mass 468 and vice versa.

Referring now to FIG. 8(b), the two decoupled sub-systems, electrical sub-system 480 and electrical sub-system 492, associated with the electric circuit 422 are shown. The models of the electric circuits 480 and 492 are generated by the decoupling unit 16 in accordance with an embodiment of the present invention.

More specifically, FIG. 8(b) shows one of the two electrical sub-systems. The electrical sub-system 480 is shown to include an inductor 490, a resistor 488, a capacitor 486 and a voltage source $g_1(t)$ 484 and a current $p_1(t)$ 482 to pass through the latter elements. The voltage source 484 is shown coupled to one end of the capacitor 486, with an opposite end of the capacitor 486 being shown coupled to the resistor 488. An opposite end of the resistor 488 is shown coupled to one end of the inductor 490 and an opposite end of the inductor 490 is shown coupled to the voltage source 484. The capacitor 486 has capacitance C, the inductor 490 has inductance L and the resistor 488 has resistance R. For the electric circuit 422, with parameters given by Eqs. (29) and (30), the decoupling unit 16 determines that L=1, R=0.36, C=0.97, and $g_1(t)$ is as given in Eq. (33).

FIG. 8(b) further shows the other of the two electrical sub-systems, electrical sub-system 492 to include an inductor 494, a resistor 498, a capacitor 496, a voltage source $g_2(t)$ 484 and a current $p_2(t)$ 502 to pass through the latter elements. The voltage source 500 is shown coupled to one end of the resistor 498, with an opposite end of the resistor 498 being shown coupled to the capacitor 496. An opposite end of the capacitor 496 is shown coupled to one end of the inductor 494 and an opposite end of the inductor 494 is shown coupled to the voltage source 500. The capacitor 496 has capacitance C, the resistor 498 has resistance R and the inductor 494 has inductance L. For the electric circuit 422, with parameters given by Eqs. (29) and (30), the decoupling unit 16 determine that L=1, R=0.54, and C=0.34. The influence of current 428 on current 430 has been eliminated by decoupling in accordance with an embodiment of the present invention. In FIG. 7(b), a current 428 always causes a current 430 and vice versa. In the decoupled sub-systems 480, 492 of FIG. 8(b), a current 482 never causes a current 502 and vice versa.

The decoupled mechanical sub-systems 450, 462 and the decoupled electrical sub-systems 480 and 492 can be individually built and easily analyzed by prior art techniques. For example, it can be stated by inspection of the two decoupled sub-systems in FIGS. 8(a) and 8(b) that both are underdamped while a statement about the nature of damping in the original coupled system cannot be made.

The physical insight provided by the decoupling method is oftentimes important in design. If the response of each decoupled sub-system in FIG. 8(a) or FIG. 8(b) is determined, the response q(t) of the original coupled system can be determined by the transformation of Eq. (22). Of course, this task has already been implemented in the algorithm of FIG. 5. This example clearly demonstrates the utility and physical insight provided by the method and apparatus of the present invention. Large coupled systems possessing many degrees of freedom can be evaluated in the same manner and, as illustrated in FIG. 6, the efficiency of response calculation by the decoupling methodology becomes more pronounced as the degree of freedom increases. Additional examples are given in Appendices A and B.

In accordance with the foregoing, a method and apparatus are disclosed to decouple and analyze any linear dynamical system. While modal analysis is only operative to decouple linear systems that are undamped or classically damped, the present invention is operative to any linear viscously damped system. Various embodiments of the present invention generalize modal analysis in the sense that the entire decoupling procedure by phase synchronization reduces to modal analysis for systems to which modal analysis is operative.

Although the present invention has been described in terms of specific embodiments, it is anticipated that alterations and modifications thereof will no doubt become apparent to those more skilled in the art. It is therefore intended that the following claims be interpreted as covering all such alterations and modifications as fall within the true spirit and scope of the invention.

What is claimed is:
1. A method for modeling a physical structure having dynamic behavior associated therewith comprising:
receiving material parameters and external excitation associated with a physical structure, by a decoupling unit, the received material parameters and external excitation being representative of the physical structure as a linear dynamical system with a set of coupled linear second-order ordinary equations;
determining the solution to a quadratic eigenvalue problem associated with the linear dynamical system;

determining of the non-classically damped modes of vibration from the solutions of the quadratic eigenvalue problem;

phase synchronizing of the damped modes of vibration, using a decoupling processor;

generating independent decoupled equations, the decoupled equations being a decoupled version of the coupled equations of the linear dynamical system.

2. The method for modeling a physical structure, as recited in claim 1, wherein the method further comprising:

transforming of the set of initial values for the original coupled equations of the linear dynamical system to a set of initial values for the independent decoupled equations modeling the same linear dynamical system;

generating solutions for the set of independent decoupled equations associated with the decoupled system; and transforming of the solution of the decoupled system to the solution of the original coupled system.

3. The method of modeling for a physical structure, as recited in claim 1, wherein the phase synchronization step is performed by a time-shifting transformation.

4. The method of modeling a physical structure, as recited in claim 3, wherein the step of performing the time-shifting transformation causes generating an intermediate system that is a classically damped system.

5. The method of modeling a physical structure, as recited in claim 4, further including decoupling the intermediate system by performing modal analysis to produce a decoupled system, as a decoupled linear dynamical system.

6. The method of modeling a physical structure, as recited in claim 5, wherein the steps of decoupling of the intermediate system and performing modal analysis are performed as two independent processes.

7. The method of modeling a physical structure, as recited in claim 6, wherein the steps of decoupling of the intermediate system and performing modal analysis are combined into a single overall time-shifting transformation.

8. The method of modeling a physical structure, as recited in claim 6, wherein the time-shifting transformation compensates for time drifts caused by both damping and an external force f(t) that is applied to the physical structure.

9. An apparatus for modeling the dynamic behavior of a physical structure having a force applied thereto comprising:
a modeling unit; and
a decoupling unit coupled to the modeling unit, the decoupling unit including,
a decoupling processor,
a parameter storage unit coupled to the decoupling processor and responsive to inputs including material parameters and external excitation, the received material parameters and external excitation being representative of the physical structure as a linear dynamical system with a set of coupled linear second-order ordinary equations, the decoupling processor operable to:
determine the solution to a quadratic eigenvalue problem associated with the linear dynamical system;
determine the non-classically damped modes of vibration from the solutions of the quadratic eigenvalue problem;
phase synchronize the damped modes of vibration,
wherein the dynamic behavior of the physical structure is modeled as a linear dynamical system;
generate independent decoupled equations, the decoupled equations being a decoupled version of the coupled equations of the linear dynamical system.

10. The apparatus, as recited in claim 9, wherein the decoupling processor is further operable to:
transform the set of initial values for the original coupled equations of the linear dynamical system to a set of initial values for the independent decoupled equations modeling the same linear dynamical system;
generate solutions for the set of independent decoupled equations associated with the decoupled system; and
transform of the solution of the decoupled system to the solution of the original coupled system.

11. The apparatus, as recited in claim 9, wherein the phase synchronization includes a time-shifting transformation.

12. The apparatus, as recited in claim 9, wherein the time-shifting transformation causes generating an intermediate system that is a classically damped system.

13. The apparatus, as recited in claim 9, wherein the intermediate system is decoupled by performing modal analysis to produce a decoupled system as a decoupled linear dynamical system.

14. The apparatus, as recited in claim 9, wherein the steps of decoupling of the intermediate system and performing modal analysis are performed as two independent processes.

15. The apparatus, as recited in claim 9, wherein the steps of decoupling of the intermediate system and performing modal analysis are combined into a single overall time-shifting transformation.

16. The apparatus, as recited in claim 9, wherein the time-shifting transformation compensates for time drifts caused by both damping and an external force f(t) that is applied to the physical structure.

* * * * *